(12) United States Patent
Kamada

(10) Patent No.: US 8,884,165 B2
(45) Date of Patent: Nov. 11, 2014

(54) PACKAGING DEVICE AND BASE MEMBER FOR PACKAGING

(75) Inventor: Hiroshi Kamada, Koka (JP)

(73) Assignee: NEC SCHOTT Components Corporation, Koka-shi (JP)

( * ) Notice: Subject to any disclaimer, the term of this patent is extended or adjusted under 35 U.S.C. 154(b) by 338 days.

(21) Appl. No.: 13/002,562

(22) PCT Filed: Jun. 22, 2009

(86) PCT No.: PCT/JP2009/061304
§ 371 (c)(1),
(2), (4) Date: Jan. 4, 2011

(87) PCT Pub. No.: WO2010/004860
PCT Pub. Date: Jan. 14, 2010

(65) Prior Publication Data
US 2011/0108308 A1 May 12, 2011

(30) Foreign Application Priority Data

Jul. 9, 2008 (JP) ................................. 2008-178554

(51) Int. Cl.
| H05K 1/03 | (2006.01) |
| B81B 7/00 | (2006.01) |
| H01L 27/146 | (2006.01) |
| H01L 23/00 | (2006.01) |
| H01L 23/31 | (2006.01) |

(52) U.S. Cl.
CPC .......... *H01L 27/14618* (2013.01); *B81B 7/007* (2013.01); *H01L 2924/10253* (2013.01); *H01L 2924/01023* (2013.01); *B81B 7/0067* (2013.01); *H01L 2924/01005* (2013.01); *H01L 2924/01033* (2013.01); *H01L 23/3121* (2013.01); *H01L 2924/01006* (2013.01); *H01L 2224/97* (2013.01); *H01L 2924/01082* (2013.01); *H01L 2924/01004* (2013.01); *H01L 2924/014* (2013.01); *H01L 2224/48091* (2013.01); *H01L 2924/01077* (2013.01); *H01L 24/97* (2013.01); *B81B 2207/07* (2013.01); *H01L 2924/01074* (2013.01); *H01L 2224/48227* (2013.01); *H01L 2924/01019* (2013.01); *H01L 2924/01078* (2013.01); *H01L 2924/12041* (2013.01)
USPC ........................................................ 174/255

(58) Field of Classification Search
USPC ........................................................ 174/255
See application file for complete search history.

(56) References Cited

U.S. PATENT DOCUMENTS

| 4,734,608 | A | * | 3/1988 | Takoshima | ................ | 310/313 R |
| 4,915,719 | A | * | 4/1990 | Saffari | ........................... | 65/32.2 |

(Continued)

FOREIGN PATENT DOCUMENTS

| EP | 1 445 861 | 8/2004 |
| JP | 6-120633 | 4/1994 |

(Continued)

OTHER PUBLICATIONS

PCT International Search Report of the International Searching Authority for International Application PCT/JP2009/061304, mailed Aug. 4, 2009, 1 page, Japanese Patent Office.
Taiwanese Office Action and Search Report in Taiwanese Patent Application No. 10320593020, mailed May 1, 2014, 5 pages, with English translation, 4 pages.

* cited by examiner

*Primary Examiner* — William H Mayo, III
*Assistant Examiner* — Hiram E Gonzalez
(74) *Attorney, Agent, or Firm* — W. F. Fasse

(57) ABSTRACT

An object of the present invention is to provide a chip-size packaging device at low cost that achieves size reduction, thickness reduction, weight reduction, and further, high reliability, by using a glass substrate with a through electrode. The packaging device according to the present invention is characterized in that a glass substrate having a plurality of through electrodes arranged at a predetermined position is used as a base member for a package that houses a device element having a group of electrodes, and the group of electrodes and the through electrodes are led out to an external circuit with a contact medium arranged to bypass a sealant being interposed between the group of electrodes and the through electrodes.

18 Claims, 4 Drawing Sheets

(56) References Cited

U.S. PATENT DOCUMENTS

| | | |
|---|---|---|
| 6,777,767 B2 * | 8/2004 | Badehi .......................... 257/432 |
| 7,211,934 B2 | 5/2007 | Fujiwara et al. |
| 7,433,555 B2 * | 10/2008 | Lee et al. ....................... 385/14 |
| 7,486,160 B2 * | 2/2009 | Tsuda et al. ................... 333/193 |
| 7,859,033 B2 * | 12/2010 | Brady ........................... 257/294 |
| 7,867,830 B2 * | 1/2011 | Hashimoto ................... 438/127 |
| 2004/0100164 A1 * | 5/2004 | Murata et al. ................. 310/348 |
| 2004/0180517 A1 | 9/2004 | Quenzer et al. |
| 2006/0016973 A1 * | 1/2006 | Yang et al. .................... 250/239 |
| 2010/0155247 A1 * | 6/2010 | Cao et al. ...................... 204/600 |

FOREIGN PATENT DOCUMENTS

| | | |
|---|---|---|
| JP | 10-107240 | 4/1998 |
| JP | 2001-160678 | 6/2001 |
| JP | 2003-201147 | 7/2003 |
| JP | 2004-214469 | 7/2004 |
| JP | 2006-140384 | 6/2006 |
| JP | 2007-067387 | 3/2007 |
| JP | 2007-312012 | 11/2007 |

(a)

(b)

PACKAGING DEVICE AND BASE MEMBER FOR PACKAGING

NATIONAL STAGE ENTRY

This application is the US National Stage under 35 USC 371 of PCT Application PCT/JP2009/061304 filed on Jun. 22, 2009, and claims the foreign priority under 35 USC 119 of Japanese patent application 2008-178554 filed on Jul. 9, 2008.

TECHNICAL FIELD

The present invention relates to a packaging device and a base member for packaging. Particularly, the present invention relates to a packaging device in which a glass substrate with a through electrode is used, and to a base member for packaging in which a glass substrate with a fine via through electrode is used.

BACKGROUND ART

Various kinds of devices such as a MEMS device, a CCD or CMOS element, and a liquid crystal have been widely employed as a compact, lightweight and high-performance device. These devices are easily influenced by the external environment because of a delicate electrode material and structure thereof, and thus, the devices are used in an airtightly-packaged manner in order to avoid this influence. In addition, in recent years, a similar airtightly-packaged image sensor has been employed within a camera module of a mobile phone, thereby responding to a demand for price reduction, in addition to size reduction, thickness reduction and weight reduction. For example, as described in Japanese Patent Laying-Open No. 10-107240 (Patent Document 1) and Japanese Patent Laying-Open No. 2006-140384 (Patent Document 2), in an image sensor including a CCD or CMOS element, after the sensor is housed in a ceramic package, electrical connection is made by wire bonding and sealing is performed by using a transparent lid such as glass. In addition, as described in Japanese Patent Laying-Open No. 2007-312012 (Patent Document 3) and U.S. Pat. No. 6,777,767 (Patent Document 4), a method for implementing CSP (Chip Size Packaging) to reduce the size of an overall image sensor is known. In these cases, a hole or a groove that passes to the surface from the rear surface of a semiconductor silicon wafer having a CCD or CMOS element formed is provided, the front side is electrically connected to the rear side, and connection to an external circuit is made by a ball bump arranged on the rear surface of the semiconductor wafer.

PRIOR ART DOCUMENTS

Patent Documents

Patent Document 1: Japanese Patent Laying-Open No. 10-107240
Patent Document 2: Japanese Patent Laying-Open No. 2006-140384
Patent Document 3: Japanese Patent Laying-Open No. 2007-312012
Patent Document 4: U.S. Pat. No. 6,777,767

SUMMARY OF THE INVENTION

Problems to be Solved by the Invention

In Japanese Patent Laying-Open No. 10-107240 (Patent Document 1) and Japanese Patent Laying-Open No. 2006-140384 (Patent Document 2), however, there has been a drawback that the plane area and the height of the overall image sensor have become extremely large, as compared with a sensor element in the image sensor. In addition, in Japanese Patent Laying-Open No. 2007-312012 (Patent Document 3) and U.S. Pat. No. 6,777,767 (Patent Document 4), although size reduction, thickness reduction and weight reduction can be achieved, a process of fabricating a hole or a groove in the semiconductor by etching and the like, applying insulation treatment to the surface of the semiconductor, and further, fabricating a wiring layer of a metal inside the hole or the groove has been required, which has increased cost. For these reasons, development of a member that configures a package has been desired as an improvement of a member for airtight packaging.

Accordingly, a first object of the present invention is to provide a novel and improved device including a semiconductor, a MEMS device or a liquid crystal panel, which can achieve size reduction, thickness reduction, weight reduction, and cost reduction.

Another object of the present invention is to provide various kinds of devices that can achieve price reduction by improving a package in which a glass substrate having a through electrode is used as a base member and by facilitating electrical connection to various kinds of device elements housed in this package and each having multiple electrodes. Particularly, the object of the present invention is to provide a novel and improved base member for packaging used in a package including a glass substrate with a through electrode having a Glass to Metal Seal (hereinafter referred to as GTMS, which is an acronym for Glass to Metal Seal) structure, which is sealed through a high-temperature heating process, and to provide various kinds of devices for packaging a device element by using the base member.

Means for Solving the Problems

In the present invention, there is provided a packaging device, wherein one or a plurality of device elements of various kinds each having multiple electrodes or a group of electrodes are housed in an airtight package, a glass substrate having a plurality of through electrodes arranged within a predetermined range is used as a base member for packaging, these through electrodes of the glass substrate are connected to the group of electrodes of the device element, and the electrodes are led out to an external circuit in such a manner that the electrodes are not in contact with a sealant for packaging. Here, in the glass substrate having the through electrodes, the through electrode is formed corresponding to a lead-out electrode of the device element, and the electrodes are led out to the external circuit with a contact medium interposed therebetween. In addition, the device element is a semiconductor, a MEMS device, an image sensor including a CCD or CMOS, or the like, and the device element is airtightly packaged to configure a chip-size device. Furthermore, the device element having multiple electrodes includes a liquid crystal panel obtained by interposing a liquid crystal between opposing electrodes and using a through electrode arranged within a glass substrate as at least one of the electrodes and forming multiple groups of transparent electrodes on the inner surface of the glass substrate. The glass substrate having the through electrodes arranged therethrough is preferably a fine via type glass substrate having a GTMS structure, and as a result, various kinds of devices advantageous for price reduction are provided. In addition, by providing the through electrode in a peripheral portion of a protective glass substrate arranged on the light receiving surface side of the CCD or CMOS element, connecting this through electrode to an electrode extraction portion provided in a peripheral portion of the light receiving surface of the CCD or CMOS element, and further, affixing and sealing this protective glass substrate and a semiconductor wafer having the CCD or CMOS element formed thereon, there is provided an image sensor at low cost that achieves size reduction, thickness reduction, weight reduction, and further, high reliability.

According to another aspect of the present invention, the use of a glass substrate having through electrodes arranged therethrough as a base member for packaging is proposed. The glass substrate is a fine via glass substrate having a GTMS structure, which is subjected to a high-temperature heating process, and a via diameter $\phi$ is 150 µm or less and a via pitch, which refers to a dimension between via centers, is 300 µm or less. There is also provided various kinds of packaging devices in each of which the fine via glass substrate is used. In other words, in order to set the dimension between via centers of the through electrodes to 300 µm or less, via diameter $\phi$ needs to be set to 250 µm or less. Via diameter $\phi$ may be smaller than this and is limited to 150 µm or less preferably. As a result, the glass substrate having the through electrodes arranged therethrough is characterized in that the airtightness of the package is ensured such that a value of airtightness measured by using a helium blowing method is less than $1\times10^{-8}$ Pa·m³/sec.

Effects of the Invention

According to the present invention, since the light receiving surface of the image sensor and a portion for attachment to an external substrate are located in the same direction, the external substrate including an external optical component such as a filter and a lens can be attached with a high degree of positional accuracy, which results in enhancement of optical property. In addition, even when not only the CCD or CMOS element but also a peripheral IC such as a DSP (Digital Signal Processor) is housed in the same package as that for the image sensor, remarkable size reduction can be achieved.

According to the present invention, there can be provided an airtightly-packaged light-applied device at low cost that achieves size reduction, thickness reduction, weight reduction, and high reliability, by using the glass substrate with the through electrodes as the base member for packaging. For example, a conventional device element has been manufactured by separating individual elements from a silicon wafer by dicing, and then, individually housing each element in a ceramic package and sealing the element, which has increased the packaging cost, and in turn, the manufacturing cost. In addition, there has been a problem in terms of electrical connection by wire bonding. This problem in terms of cost is eliminated by using the glass substrate with the plurality of through electrodes as the base member for packaging.

In the present invention, features about various kinds of methods for manufacturing the glass substrate with the through electrodes have been studied and the use of the fine via glass substrate manufactured by using a GTMS method has been found. In this glass substrate, a minute via pitch and enhancement of airtightness are achieved by a high-temperature process, and thereby size reduction and high reliability can be achieved.

MODES FOR CARRYING OUT THE INVENTION

Figure 1:
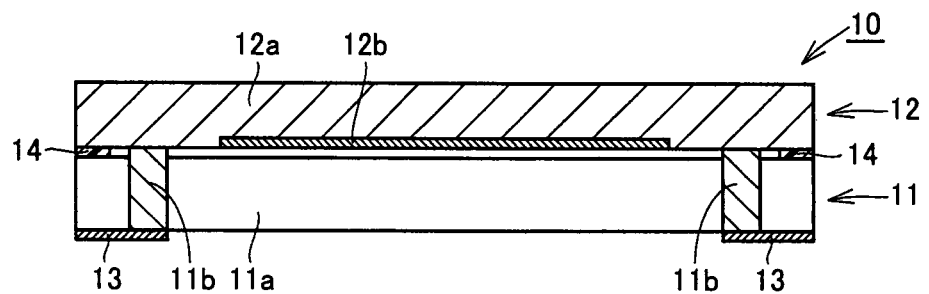
FIG. 1 is a cross-sectional view of a configuration of an image sensor of a first example of the present invention.

The present invention will be described in more detail hereinafter. In the following, embodiments will be described using the drawings. In the drawings of the present application, the same or corresponding portions will be denoted with the same reference characters.

The present invention is directed to a packaging device that is a sensor or light-applied device, wherein a package that houses a MEMS or light-applied device element having a group of electrodes is included, a glass substrate having a plurality of through electrodes arranged at a predetermined position is used as a base member for this package, the group of electrodes are connected to the through electrodes, and the electrodes are led out. In addition, the device element is a semiconductor, a MEMS device, a sensor, a liquid crystal panel, or a CCD or CMOS image sensor. Here, the through electrode is formed corresponding to an electrode of the group of electrodes, both electrodes are connected directly or with a contact medium such as a bump interposed therebetween, and these electrodes are led out and connected to an external circuit with the sealant bypassed. It is noted that a liquid crystal element is configured by interposing a liquid crystal between opposing transparent electrodes, and a liquid crystal display is configured by multiple liquid crystal panels, in each of which one transparent electrode is formed at the glass substrate having the through electrodes arranged therethrough. Here, the glass substrate is configured by a glass substrate whose through electrodes are each a GTMS-type fine via having a Glass to Metal Seal structure. An outer diameter $\phi$ of the via is preferably set to 150 µm or less and a pitch between via centers is preferably set to 300 µm or less. In addition, the via is processed and fabricated through a high-temperature process, and a degree of airtightness of the via is preferably such that a value of airtightness measured by using a helium blowing method is less than $1\times10^{-8}$ Pa·m³/sec. Outer diameter $\phi$ and the dimension between via centers are limited for formation of the fine via. The glass substrate having this through electrode with the GTMS-type fine via arranged therethrough is used as the base member to provide a packaged device. Furthermore, by setting the degree of airtightness of the package to be high, the reliability of the fine package is enhanced. In addition, such packaging is provided at low cost. Moreover, a particular glass obtained by a float method is used to provide a high-quality, colorless and transparent glass, which offers a merit such as adaptation to the high frequency application even in the relative dielectric constant property. The particular glass refers to, for example, low-alkali borosilicate glass and the like obtained by the float method. It is noted that the degree of airtightness refers to, for example, a value measured in the helium blowing method by using the leak tester HELIOT701 produced by ULVAC, Inc.

A light-applied device in which the glass substrate having the through electrodes arranged therethrough according to the present invention is used for packaging includes, for example, a liquid crystal panel that is configured by interposing a spacer between a pair of glass substrates each having multiple transparent electrodes formed at a glass surface, filling a liquid crystal, and airtightly sealing both substrates with a sealing material, and in which a voltage, is applied between the electrodes. This liquid crystal panel is configured such that the glass substrate with the through electrodes is used and the electrodes are led out to the outside without passing between the glass and a sealing member made of the sealing material. This liquid crystal panel differs from a conventional configuration in which electrodes pass between glass and a sealing material and are led out from within a panel to the outside. Therefore, leakage of the liquid crystal from the sealing member can be avoided, and a broader choice of the sealing material can be offered. In addition, an electrode lead-out portion is brought together on one side of the panel, which simplifies a wiring in the device. This is because the glass substrate with the electrodes is used and the electrodes are led out from within the panel to the external circuit without passing between the glass and the sealing material.

Another aspect of the present invention is to provide a packaged device that is a sensor or light-applied device, wherein a glass substrate having a plurality of through electrodes arranged at a predetermined position is used as a base member for a package that houses a MEMS or light-applied device element having a group of electrodes formed of multiple electrodes, and the group of electrodes and the through electrodes are led out to an external circuit with a contact medium interposed therebetween. The device element is a CCD or CMOS image sensor, a semiconductor, a MEMS device, or a liquid crystal panel, and chip-size packaging is performed. In addition, the liquid crystal panel is configured by multiple liquid crystal panels, in each of which a liquid crystal is interposed between opposing electrodes and one transparent electrode is formed at the glass substrate having the through electrodes arranged therethrough. Here, each of the through electrodes arranged at the predetermined position of the glass substrate has a Glass to Metal Seal structure (referred to as GTMS structure hereinafter) and is a fine via through electrode. This fine via through electrode has a microstructure in which an outer diameter $\phi$ of the via is 150 μm or less and a pitch between via centers is 300 μm or less. In addition, the glass substrate is fabricated through a high-temperature heating GTMS process, and the fine via through electrode is arranged at the predetermined position at such an airtightness that a value of airtightness measured by using a helium blowing method is less than $1 \times 10^{-8}$ Pa·m³/sec.

According to still another aspect, a glass substrate is used, in which a plurality of through electrode vias each formed of a metal conductor and having a Glass to Metal Seal structure are arranged at a predetermined position. This glass substrate is a glass substrate in which the plurality of through electrodes each formed of a metal conductor and having the Glass to Metal Seal structure are arranged at the predetermined position. There is provided a base member for packaging, wherein such glass substrate is used and the through electrodes of this glass substrate are each buried to have an outer diameter $\phi$ of the via of 150 μm or less and a dimension between via centers of 300 μm or less. In addition, there is provided the base member for packaging, wherein a degree of airtightness of the through electrodes in this glass substrate is such that a value of airtightness measured by using a helium blowing method is less than $1 \times 10^{-8}$ Pa·m³/sec.

EXAMPLE

While the present invention will be described in more detail hereinafter in Examples, the present invention is not limited to these Examples.

Example 1

In an image sensor according to the present Example 1 (a first example), a CCD type or CMOS type light receiving portion is formed on a first main surface of a semiconductor substrate, and a wiring for signal drawing is provided on the same surface. A pad for connection to an external circuit is provided in a peripheral portion of this first main surface of the semiconductor substrate. A glass substrate with a through electrode is arranged to cover this first main surface, and the through electrode is configured to be electrically connected to the aforementioned pad. A sealant is arranged in a peripheral portion of the surface where the semiconductor substrate faces the glass substrate with the through electrode, thereby mechanically bonding the semiconductor substrate to the glass substrate with the through electrode, and blocking and protecting the light receiving portion from the external environment. As described above, a packaging device is formed.

Examples according to the present invention will be described in detail hereinafter with reference to the drawings. FIG. 1 is a partial cross-sectional view of a main portion illustrating a schematic configuration of an image sensor 10 as the first example of the present invention. As shown in the figure, in this image sensor 10, a CCD type or CMOS type light receiving portion 12b is formed on a first main surface of a semiconductor substrate 12 (semiconductor substrate 12a), and a wiring (not shown) for signal drawing is provided on the same surface. A pad (not shown) for connection to an external circuit is provided in a peripheral portion of this first main surface of semiconductor substrate 12. A glass substrate 11 with a through electrode is arranged to cover this first main surface, and a through electrode 11b is electrically connected to the aforementioned pad. Furthermore, a sealant 14 is arranged in a peripheral portion of the surface where semiconductor substrate 12 faces glass substrate 11 with the through electrode, thereby mechanically bonding semiconductor substrate 12 to glass substrate 11 with the through electrode, and protecting light receiving portion 12b from the external environment. As described above, a packaging device is configured. Here, sealant 14 that mechanically couples semiconductor substrate 12 to glass substrate 11 with the through electrode and blocks and protects light receiving portion 12b from the external environment is provided to avoid the electrode position on the pad that joins the element electrode to through electrode 11b, and a route for lead-out to the outside bypasses sealant 14. It is noted that a resin, a metal or a glass material is used as sealant 14, depending on how much airtightness of a sealing portion is required. When the high degree of airtightness is required, a metal or a glass material such as a solder and a brazing material is suitable. When the low degree of airtightness is required, sealing with a resin is also possible. In addition, an external electrode 13 that connects to through electrode 11b is provided on a surface of glass substrate 11 with the through electrode where glass substrate 11 with the through electrode is not in contact with semiconductor substrate 12, which allows connection to the external circuit such as a printed substrate.

Figure 2:
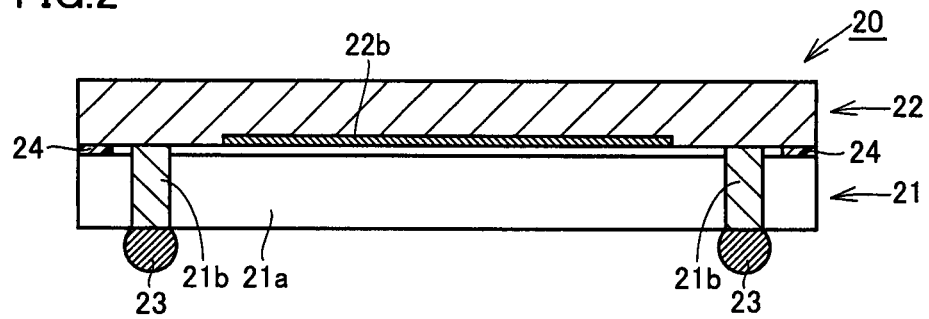
FIG. 2 is a cross-sectional view of another configuration of the image sensor of the first example of the present invention.

Furthermore, there is a structure shown in FIG. 2 as a modification of the structure for leading out the external electrode in the above Example 1. In this case, in order to lead out the external electrode, a ball bump 23 is arranged instead of external electrode 13 in FIG. 1. The structure is similar to the structure in FIG. 1 except for ball bump 23. A CCD type or CMOS type light receiving portion 22b is formed on a first main surface of a semiconductor substrate 22, a glass substrate 21 with a through electrode is arranged to cover the first main surface, and a through electrode 21b is electrically connected to a pad as in FIG. 1. In addition, semiconductor substrate 22 is mechanically bonded to the glass substrate with the through electrode by a sealant 24 as in FIG. 1. This method allows easy implementation of the structure for extracting the electrode to the outside. As described above, according to the first example, there can be provided an image sensor at low cost that allows sealing protection of light receiving portion 12b and extraction of a signal wiring to the outside at relatively low cost, and achieves size reduction, thickness reduction, weight reduction, and high reliability, without performing processing for forming a groove or a hole in semiconductor substrate 12 and without the need for a metal wiring and insulation treatment to such groove or hole.

Next, a specific case of manufacture for preparing glass substrate 11 with the through electrode will be detailed. As typical methods, there are three methods: a sandblast method; a drill hole-making method and a GTMS manufacturing method. Glass substrates obtained by using the respective methods will be compared and described. First, in the sandblast method, the practical hole diameter is 300 μm or more, although it depends on the thickness of the substrate. In addition, since a taper is created in the cross-sectional direction, forming a minute pitch is difficult. Chipping occurs easily at an end of a processed portion, and a break in wiring and trouble caused by generation of glass waste after mounting occurs easily. Next, in the hole-making method with a drill, although a straight hole can be formed, the practicable hole diameter is restricted by the limit of the drill diameter, and thus, the practicable hole diameter is approximately 300 μm, which is similar to the hole diameter in the sandblast method. In addition, a hole is normally made one by one, which results in a remarkable increase in processing time. In hole making with a laser as well, making a straight hole is difficult in reality and control of the hole diameter is also difficult. Furthermore, there is also a problem that a large distortion remains in the processed portion in the case of laser processing to glass. On the other hand, the GTMS manufacturing method is similar to a method for manufacturing an airtight terminal. The airtight terminal is a component of an airtight package that efficiently supplies electric power to a device and efficiently inputs/outputs electricity or a light signal from/to the device. A package structure having high adhesiveness and airtightness is obtained by a process of using a metal and a glass as basic constituent materials and bonding or inserting a heat-resistant metal component to or into the glass having enhanced fluidity and physicochemical activity at a high temperature that is the softening point of the glass or higher. A glass substrate with a through electrode produced by using this method, for example, a method disclosed in Japanese Patent Laying-Open No. 2007-067387, can be fabricated at relatively low cost. Accordingly, this glass substrate with the through electrode is desirably applied as a constituent component of the present invention. The glass substrate fabricated by using this GTMS manufacturing method will be referred to as a fine via glass substrate hereinafter.

Table 1 shows features about three different types of methods employed as a method for manufacturing the glass substrate with the through electrode used in the present invention. The glass material of the glass substrate must be selected in accordance with a processing method and a purpose of use. This Table 1 shows the features and four-category evaluation in a practical aspect about six items. On the other hand, Table 2-1 and Table 2-2 show features when the glass substrate with the through electrode is manufactured as the fine via glass substrate by using one of the manufacturing methods shown in Table 1. Nine items are listed here as physical properties of used materials. For example, as for the used materials, commercially available TEMPAX Float (registered trademark) is used as the glass material, and tungsten (W) is used as the metal material for the electrode.

TABLE 1

Comparison Table of Features and Whether Appropriate or Not in Use about Different Methods for Manufacturing Glass Substrate with Through Electrode

| | | Sandblast Method | Drill Hole-Making Method | GTMS Manufacturing Method |
|---|---|---|---|---|
| 1. | Various Kinds of Hole-Making Methods | | | |
| 2. | Material Used in Via and Processing Treatment Method | conductive paste sputtering plating | fired electrode material metal embedding plating | bulk metal high-temperature process treatment |
| 3. | Vertical Side Shape of Hole | taper: evaluation Insufficient | straight: evaluation Very Good | straight: evaluation Very Good |
| 4. | Outer Diameter ϕ of Via | large: evaluation Insufficient | large: evaluation Insufficient | minute: evaluation Very Good |
| 5. | Pitch of Via | depend on hole diameter: evaluation Insufficient | depend on hole diameter: evaluation Insufficient | tool accuracy: evaluation Good |
| 6. | Airtightness | paste: evaluation Insufficient | vapor deposition method: evaluation Fair | GTMS: evaluation Very Good |
| 7. | Manufacturing Cost | high processing cost: evaluation Insufficient | individual treatment: evaluation Insufficient | one-time treatment: evaluation Good |

In Table 1, evaluation results are expressed in four levels in each item as "Very Good" when a criterion required for a presently cutting-edge MEMS device and the like is fully met, as "Good" when the criterion is almost met, as "Fair" when the criterion is partially or inadequately met, and as "Insufficient" when the criterion is not met.

TABLE 2-1

Properties of Glass Substrate with Via Manufactured by Using GTMS Manufacturing Method

| Property Items of Substrate | Properties of Glass Substrate with Through Electrode Via |
|---|---|
| Properties of Wafer Substrate | size: 2-8 inches, thickness: 500-600 ± 20 μm |
| Outer Diameter ϕ of Via | ϕ 100 μm or ϕ 150 μm (Max ϕ 250 μm) |
| Pitch of Via (between Centers) | depend on outer diameter ϕ, a pitch of 300 μm or less is achievable |
| Airtightness (Helium blowing method) | $<1 \times 10^{-8}$ Pa · m$^3$/sec |

TABLE 2-2

Table of Physical Properties of Materials Used in Glass Substrate with Via

| Property Items of Used Materials | Physical Properties of Glass Material | Physical Properties of Via Material |
|---|---|---|
| 1. Thermal Expansion Coefficient (CTE) | $3.25 \times 10^{-6}/K$ | $4.5 \times 10^{-6}/K$ |
| 2. Bending Strength σ | 25 MPa | — |
| 3. Density | $2.2 \text{ g/cm}^3$ | $19.3 \text{ g/cm}^3$ |
| 4. Relative Dielectric Constant εr | 4.6 (25° C., 1 MHz) | — |
| 5. Dielectric Loss Rate Tanδ | $37 \times 10^{-4}$ (25° C., 1 MHz) | — |
| 6. Volume Resistivity | $>10^{13}$ (25° C.), $2 \times 10^8 \, \Omega \cdot \text{cm}$ (250° C.) | $5.5 \times 10^{-6}$ $\Omega \cdot \text{cm}$ (25° C.) |
| 7. Refractive Index n | 1.47 (wavelength 600 nm) | — |
| 8. Content Rate of $NaO_2/KO_2$ | 4% | — |
| 9. Name of Used Materials | TEMPAX Float (registered trademark) | Tungsten (W) |

Table 2-1 shows that the wafer substrate has a thickness of 500±20 μm or more and 600±20 μm or less. In addition, the content rate of $NaO_2/KO_2$ in Table 2-2 refers to the ratio of the composition of the sum of these compounds ($NaO_2$ and $KO_2$) to the total composition of the glass material.

Example 2

Figure 3:
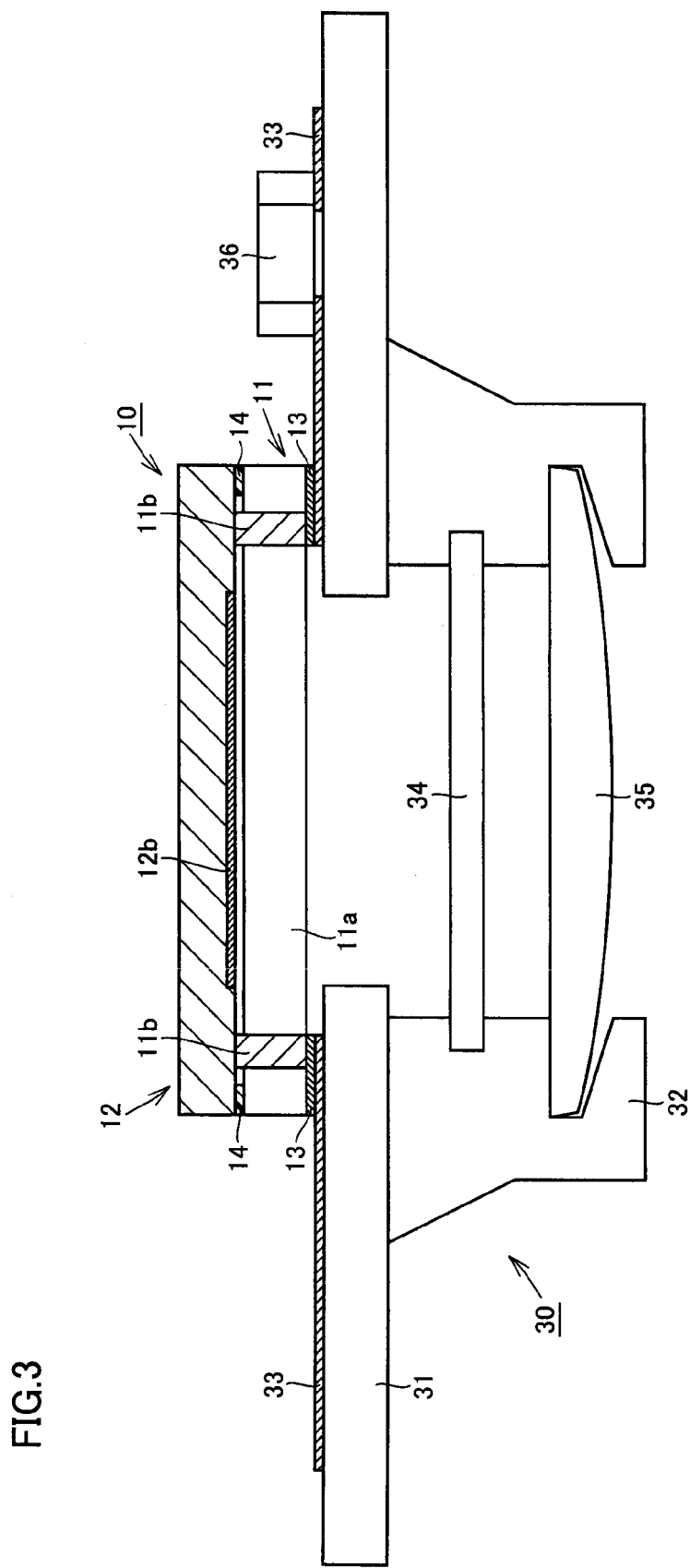
FIG. 3 is a cross-sectional view of a configuration of a camera module of a second example of the present invention.

The present Example 2 (a second example) is directed to a camera module 30 fabricated by using the image sensor of Example 1. As shown in FIG. 3, image sensor 10 is arranged on a printed wiring board 31 having an opening at a position corresponding to light receiving portion 12b of image sensor 10. External electrode 13 of image sensor 10 is electrically connected to a wiring 33 on printed wiring board 31 by a solder and the like (not shown). An optical component such as an IR cut filter 34 and a lens 35 is supported by a supporting member 32 on the opposite side of a surface of printed wiring board 31 where image sensor 10 is arranged, and is bonded to printed wiring board 31. Printed wiring board 31 and supporting member 32 may be integrally molded using a resin. Here, one or a plurality of external components 36 may be connected as needed to wiring 33 of printed wiring board 31. According to this second example, vertical arrangement of light receiving portion 12b of image sensor 10 with respect to an optical axis of lens 35 is easy and the optical property of camera module 30 is enhanced. Furthermore, there can be provided a camera module that achieves size reduction, thickness reduction and weight reduction.

Example 3

Figure 4:
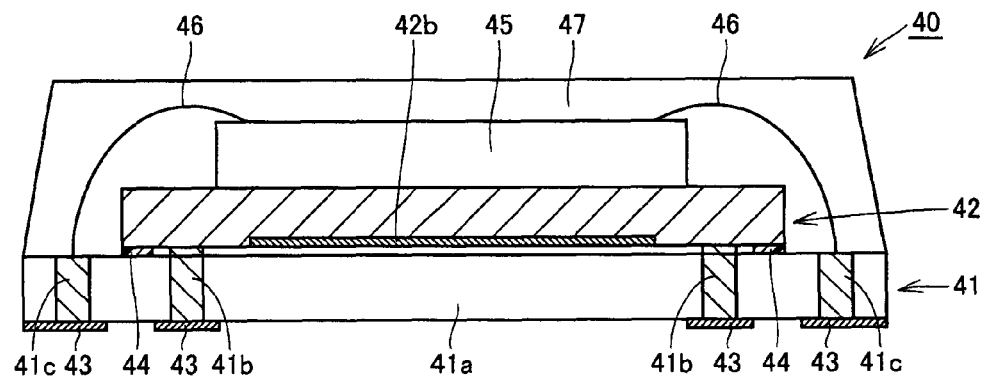
FIG. 4 is a cross-sectional view of a configuration of an image sensor module of a third example of the present invention.

FIG. 4 is a cross-sectional view of an image sensor module 40 of a third example of the present invention in which an image sensor and a digital signal processor (DSP) that processes a signal from the image sensor are housed in the same package. As shown in FIG. 4, a CCD type or CMOS type light receiving portion 42b is formed on a first main surface of a semiconductor substrate 42, a wiring (not shown) for signal drawing is provided on the same surface, and a pad (not shown) for connection to an external circuit is provided in a peripheral portion of the first main surface. A glass substrate 41 with a through electrode is arranged to cover this first main surface, and a through electrode 41b is electrically connected to the aforementioned pad. In addition, a sealant 44 is arranged in a peripheral portion of the surface where semiconductor substrate 42 faces glass substrate 41 with the through electrode, thereby mechanically bonding semiconductor substrate 42 to glass substrate 41 with the through electrode, and blocking and protecting light receiving portion 42b from the external environment. Furthermore, an external electrode 43 that connects to through electrode 41b is provided on a surface of glass substrate 41 with the through electrode where glass substrate 41 with the through electrode is not in contact with semiconductor substrate 42, which allows connection to the external circuit such as a printed substrate.

Furthermore, glass substrate 41 with the through electrode has a through electrode 41c at a position radially outer than through electrode 41b serving as an electrode for connection to semiconductor substrate 42. In addition, a DSP 45 is arranged on the opposite side of the surface of semiconductor substrate 42 including light receiving portion 42b. An input/output terminal (not shown) to the outside of DSP 45 is connected to through electrode 41c in glass substrate 41 with the through electrode by a bonding wire 46. Furthermore, semiconductor substrate 42, DSP 45 and bonding wire 46 are covered with a resin 47 to fix the positional relationship and the connection state thereof. Resin 47 adheres tightly to one surface of glass substrate 41 with the through electrode and determines the overall shape of image sensor module 40.

Figure 5:
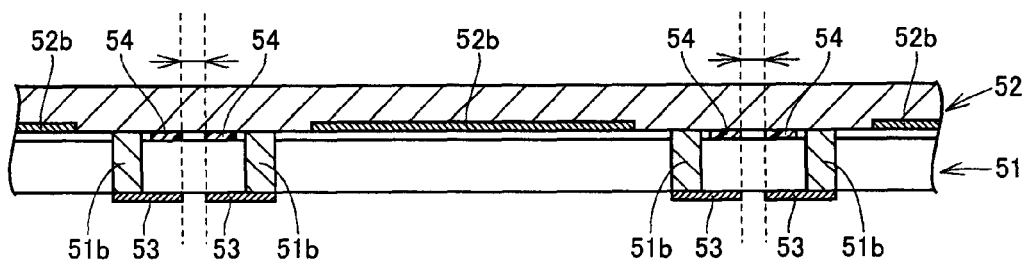
FIGS. 5($a$) and ($b$) are cross-sectional views for describing a process of manufacturing the image sensor of the first example of the present invention.
Figure 5:
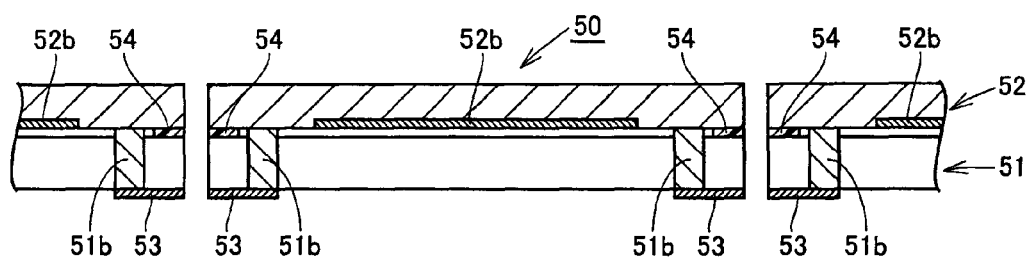

Although FIGS. 1, 2 and 4 illustrate one packaging device, respectively, about the first and third examples, a plurality of packaging devices can be fabricated at the same time in the manufacturing process. In other words, as shown in FIGS. 5(a) and 5(b), when an image sensor 50 of the first example is produced, a semiconductor wafer 52 is first prepared, in which a plurality of CCD type or CMOS type light receiving portions 52b are formed on a first main surface, a wiring (not shown) for signal drawing is provided on the same surface, and a pad (not shown) for connection to an external circuit is provided in a peripheral portion of light receiving portion 52b. Next, a glass substrate 51 with a through electrode is arranged to cover this first main surface, and a through electrode 51b is electrically connected to the aforementioned pad. In addition, in a peripheral portion of each light receiving portion 52b, a sealant 54 is arranged on the surface where semiconductor wafer 52 faces glass substrate 51 with the through electrode, thereby mechanically bonding semiconductor wafer 52 to glass substrate 51 with the through electrode, and blocking and protecting each light receiving portion 52b from the external environment. Furthermore, an external electrode 53 that connects to through electrode 51b is provided on a surface of glass substrate 51 with the through electrode where glass substrate 51 with the through electrode is not in contact with semiconductor wafer 52, which allows connection to the external circuit such as a printed substrate. Thereafter, a portion of integrally bonded semiconductor wafer 52 and glass substrate 51 with the through electrode, which is shown by a broken line and an arrow in FIG. 5(a), is cut using a dicer. As a result, a plurality of image sensors 50 separated into individual pieces as shown in FIG. 5(b) are obtained.

On the other hand, as shown in FIGS. 6(a) to 6(e), when an image sensor module 60 of the third example is produced, a semiconductor wafer 62 is first prepared, in which a plurality of CCD type or CMOS type light receiving portions 62b are formed on a first main surface, a wiring (not shown) for signal drawing is provided on the same surface, and a pad (not shown) for connection to an external circuit is provided in a peripheral portion of light receiving portion 62b. Next, a glass substrate 61 with a through electrode is arranged to cover this first main surface, and a through electrode 61b is electrically connected to the aforementioned pad (see FIG. 6(a)). In addition, in a peripheral portion of each light receiving portion 62b, a sealant 64 is arranged on the surface where semiconductor wafer 62 faces glass substrate 61 with the through electrode, thereby mechanically bonding semiconductor wafer 62 to glass substrate 61 with the through electrode, and blocking and protecting each light receiving portion 62b from the external environment. Furthermore, an external electrode 63 that connects to through electrode 61b is provided on a surface of glass substrate 61 with the through electrode where glass substrate 61 with the through electrode is not in contact with semiconductor wafer 62, which allows connection to the external circuit such as a printed substrate. In addition, glass substrate 61 with the through electrode further has a through electrode 61c at a position radially outer than through electrode 61b serving as an electrode for connection to semiconductor wafer 62. Through electrode 61c is an electrode for subsequently connecting a DSP 65 by a bonding wire 66.

Figure 6:
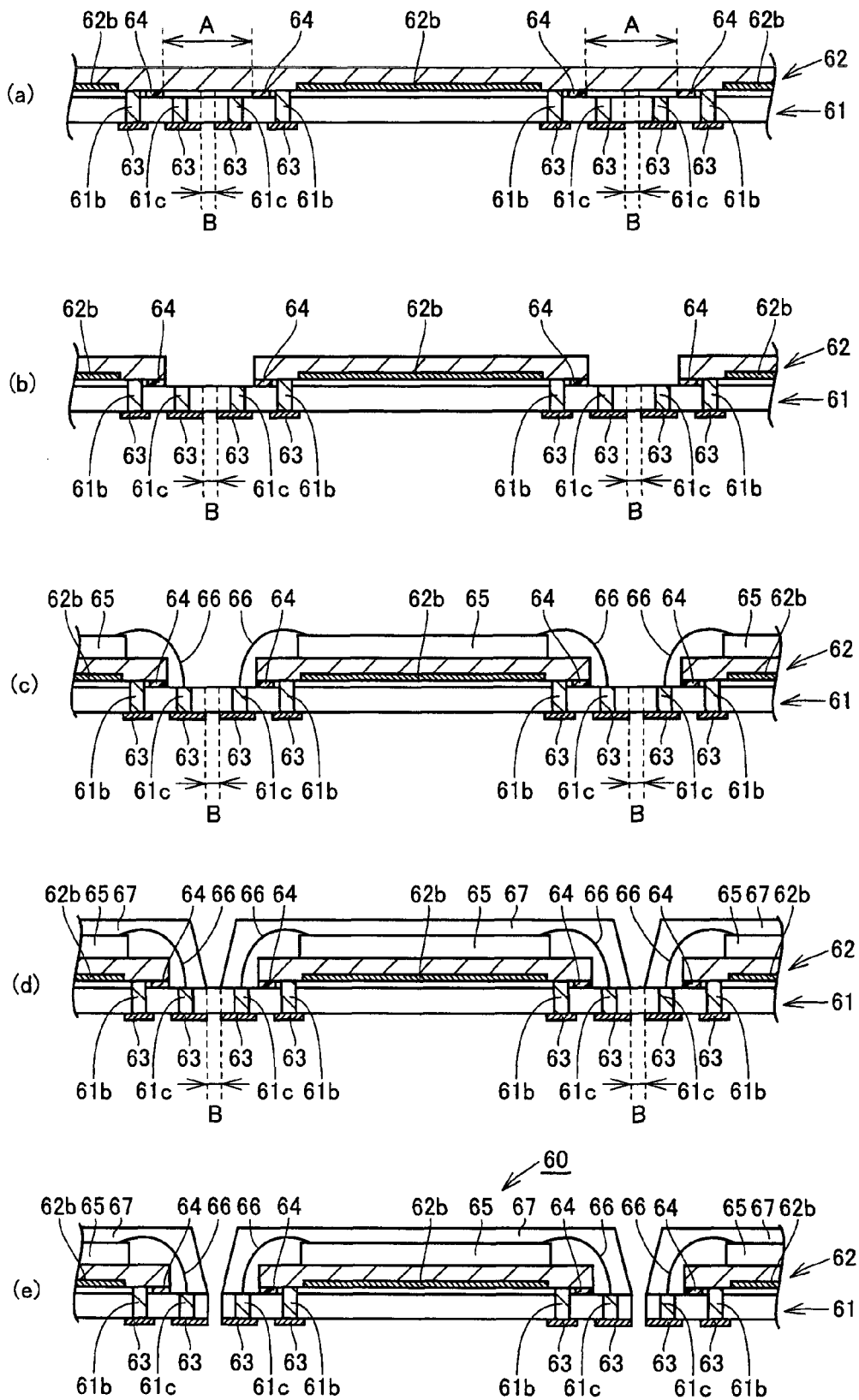
FIGS. 6($a$), ($b$), ($c$), ($d$), and ($e$) are cross-sectional views for describing a process of manufacturing the image sensor module of the third example of the present invention.

Here, a portion of semiconductor wafer 62 shown by an arrow A in FIG. 6(a) is cut using the dicer. As a result, an intermediate product shown in FIG. 6(b) is obtained. As shown in FIG. 6(c), in this intermediate product, each DSP 65 is bonded and arranged on the opposite side of the surface including each light receiving portion 62b of semiconductor wafer 62 cut into an individual piece, and an input/output terminal (not shown) to the outside of DSP 65 is connected to through electrode 61c in glass substrate 61 with the through electrode by bonding wire 66. Next, as shown in FIG. 6(d), a set of semiconductor wafer 62, DSP 65 and bonding wire 66 that has been cut into an individual piece is covered with a resin 67. Finally, a portion of glass substrate 61 with the through electrode shown by an arrow B in FIG. 6(d) is cut using the dicer. As a result, a final product shown in FIG. 6(e) is obtained. The fine via glass substrate having the GTMS structure, which is the characteristic of the present invention, is used as the glass substrate with the through electrode in each of the above examples, and the properties of this glass substrate are shown in Table 2.

Although FIGS. 5(a) to 5(b) and FIGS. 6(a) to 6(e) illustrate an overall cross-sectional view of one image sensor or image sensor module and a partial cross-sectional view of adjacent two image sensors or image sensor modules, more image sensors or image sensor modules are arranged in the X direction (horizontal direction) and in the Y direction (vertical direction) in the actual manufacturing process, depending on the size of a semiconductor wafer or the glass substrate with the through electrode formed in the form of wafer.

As described above, the embodiments and the examples of the present invention have been described. It is also expected from the beginning that the configurations of the embodiments and the examples described above are combined as appropriate.

It should be understood that the embodiments and the examples disclosed herein are illustrative and not limitative in any respect. The scope of the present invention is defined by the terms of the claims, rather than the description above, and is intended to include any modifications within the scope and meaning equivalent to the terms of the claims.

DESCRIPTION OF THE REFERENCE SIGNS

10, 20, 50 image sensor; 30 camera module; 40, 60 image sensor module; 11, 21, 41, 51, 61 glass substrate; 11a, 21a, 41a, 51a, 61a glass; 11b, 21b, 41b, 41c, 51b, 61b, 61c through electrode; 12, 22, 42, 52, 62, 12a semiconductor substrate; 12b, 22b, 42b, 52b, 62b light receiving portion; 13, 23, 43, 53, 63 external electrode; 14, 24, 44, 54, 64 sealant; 31 printed wiring board; 32 supporting member; 33 wiring; 34 IR cut filter; 35 lens; 36 external component; 45, 65 DSP; 46, 66 bonding wire; 47, 67 resin; 52, 62 semiconductor wafer

The invention claimed is:

1. A packaged optoelectronic device comprising:
a semiconductor substrate that has an optoelectronic device structure and an electrical contact structure provided on a first surface of said semiconductor substrate;
a transparent glass substrate that is arranged spaced apart from said first surface with a gap therebetween and covering said optoelectronic device structure and said electrical contact structure, and that includes an optically transparent glass window area over said optoelectronic device structure allowing light from an exterior environment to pass through said window area to said optoelectronic device structure;
plural metal wire electrodes that respectively extend straight through an entire thickness of said glass substrate in respective vias penetrating through said glass substrate at respective locations beside said window area, wherein said metal wire electrodes are respectively hermetically sealed directly to said glass substrate respectively by glass-to-metal-seals formed in said vias, and wherein said metal wire electrodes further extend continuously and integrally beyond and away from a surface of said glass substrate through said gap and contact said electrical contact structure on said first surface of said semiconductor substrate; and
a continuous perimeter seal bead of a sealant material that is sandwiched between and hermetically sealed to said semiconductor substrate and said glass substrate in said gap, along an entire perimeter outwardly around and spaced outwardly away from said metal wire electrodes, said electrical contact structure, said optoelectronic device structure, and said window area;
wherein said optoelectronic device structure is hermetically sealed and enclosed from said exterior environment by said semiconductor substrate, said continuous perimeter seal bead, and said glass substrate including said metal wire electrodes sealed in said vias by said glass-to-metal-seals.

2. The packaged optoelectronic device according to claim 1, wherein said vias have a spacing pitch of at most 300 μm between centers of adjacent ones of said vias, and each one of said vias and each one of said wire electrodes respectively has a diameter of at most 150 μm.

3. The packaged optoelectronic device according to claim 1, wherein said glass-to-metal-seals provide a degree of airtightness with a value of airtightness of less than $1 \times 10^{-8}$ Pa·m$^3$/sec as measured by a helium blowing method.

4. The packaged optoelectronic device according to claim 1, wherein said optoelectronic device structure comprises a CCD image sensor or a CMOS image sensor.

5. The packaged optoelectronic device according to claim 1, wherein said optoelectronic device structure comprises a MEMS device.

6. The packaged optoelectronic device according to claim 1, wherein said optoelectronic device structure comprises a liquid crystal display element.

7. The packaged optoelectronic device according to claim 1, wherein said electrical contact structure comprises electrically conductive traces on said first surface of said semiconductor substrate and bump electrodes, wire bonds or a ball grid array that is arranged on said electrically conductive traces and conductively between said metal wire electrodes and said electrically conductive traces.

8. The packaged optoelectronic device according to claim 1, wherein said sealant material does not contact said metal wire electrodes.

9. The packaged optoelectronic device according to claim 1, wherein said sealant material comprises a resin.

10. The packaged optoelectronic device according to claim 1, wherein said sealant material comprises a metal.

11. The packaged optoelectronic device according to claim 1, wherein said sealant material comprises a glass.

12. The packaged optoelectronic device according to claim 1, further comprising an integrated circuit arranged on said semiconductor substrate.

13. The packaged optoelectronic device according to claim 12, wherein said integrated circuit comprises a digital signal processor.

14. The packaged optoelectronic device according to claim 12, wherein said integrated circuit is arranged on a second surface of said semiconductor substrate opposite said first surface.

15. The packaged optoelectronic device according to claim 14, further comprising an additional metal wire electrode extending through an additional via that penetrates through said glass substrate at a location laterally adjacent to said semiconductor substrate, an additional glass-to-metal-seal formed in said additional via, a bond wire connecting said integrated circuit to said additional metal wire electrode, and a resin encapsulation that covers, bonds and encapsulates said integrated circuit on said semiconductor substrate on said glass substrate.

16. The packaged optoelectronic device according to claim 1,
further in combination with a printed circuit board having a hole, and a light filter and a lens that are mounted on said printed circuit board in alignment with said hole,
wherein said glass substrate is mounted on said printed circuit board opposite said light filter and said lens with said window area in alignment with said hole.

17. The packaged optoelectronic device according to claim 1, wherein said vias are not mechanically drilled holes and are not laser-burned holes and are not sandblasted holes, and wherein said vias are formed by inserting said metal wire electrodes into a heated viscous or fluid glass material which is then cooled to form said glass substrate with said glass-to-metal-seals around said metal wire electrodes.

18. A packaged optoelectronic device comprising:
a semiconductor substrate that has an optoelectronic device structure and an electrical contact structure provided on a first surface of said semiconductor substrate;
an integrated circuit that is arranged on a second surface of said semiconductor substrate opposite said first surface;
a transparent glass substrate that is arranged spaced apart from said first surface with a gap therebetween and covering said optoelectronic device structure and said electrical contact structure, and that includes an optically transparent glass window area over said optoelectronic device structure allowing light from an exterior environment to pass through said window area to said optoelectronic device structure;
plural metal wire electrodes that respectively extend straight through an entire thickness of said glass substrate in respective vias penetrating through said glass substrate at respective locations beside said window area, wherein said metal wire electrodes are respectively hermetically sealed directly to said glass substrate respectively by glass-to-metal-seals formed in said vias, and wherein said metal wire electrodes further extend beyond said glass substrate through said gap and contact said electrical contact structure on said first surface of said semiconductor substrate;
a continuous perimeter seal bead of a sealant material that is sandwiched between and hermetically sealed to said semiconductor substrate and said glass substrate in said gap, along an entire perimeter outwardly around and spaced outwardly away from said metal wire electrodes, said electrical contact structure, said optoelectronic device structure, and said window area; and
an additional metal wire electrode extending through an additional via that penetrates through said glass substrate at a location laterally adjacent to said semiconductor substrate, an additional glass-to-metal-seal formed in said additional via, a bond wire connecting said integrated circuit to said additional metal wire electrode, and a resin encapsulation that covers, bonds and encapsulates said integrated circuit on said semiconductor substrate on said glass substrate;
wherein said optoelectronic device structure is hermetically sealed and enclosed from said exterior environment by said semiconductor substrate, said continuous perimeter seal bead, and said glass substrate including said metal wire electrodes sealed in said vias by said glass-to-metal-seals.

* * * * *